US010993344B1

(12) United States Patent
Matsuda et al.

(10) Patent No.: US 10,993,344 B1
(45) Date of Patent: Apr. 27, 2021

(54) CONNECTION STRUCTURE AND ASSEMBLY

(71) Applicant: FANUC CORPORATION, Yamanashi (JP)

(72) Inventors: Ryou Matsuda, Yamanashi-ken (JP); Taku Sasaki, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 17/075,851

(22) Filed: Oct. 21, 2020

(30) Foreign Application Priority Data

Oct. 23, 2019 (JP) .............................. JP2019-192613

(51) Int. Cl.
*H05K 1/14* (2006.01)
*H05K 7/12* (2006.01)
*H05K 1/02* (2006.01)

(52) U.S. Cl.
CPC ............ *H05K 7/12* (2013.01); *H05K 1/0284* (2013.01); *H05K 1/144* (2013.01); *H05K 2201/09063* (2013.01); *H05K 2201/2027* (2013.01); *H05K 2201/2036* (2013.01); *H05K 2201/2072* (2013.01)

(58) Field of Classification Search
CPC ...................... H05K 1/0284; H05K 1/14–148
See application file for complete search history.

(56) References Cited

FOREIGN PATENT DOCUMENTS

JP          2001-168243 A          6/2001

*Primary Examiner* — Jeremy C Norris
(74) *Attorney, Agent, or Firm* — Robert P. Michal, Esq.; Carter, DeLuca & Farrell LLP

(57) ABSTRACT

A connection structure includes: a support column member extending in one direction from one end to an opposite end, with the one end attached to an installation object and the opposite end having formed therein a screw hole, the support column member being configured to be non-insertable into the through hole; a surrounding member provided on a first surface of the printed board and configured to surround the opening of the through hole and to allow the opposite end of the support column member to be inserted into the surrounding member; and a fastener configured to fix the support column member to the printed board by being screw-engaged into the screw hole of the support column member inserted into the surrounding member, from a second surface side opposite to the first surface of the printed board.

9 Claims, 5 Drawing Sheets

CONNECTION STRUCTURE AND ASSEMBLY

CROSS-REFERENCE TO RELATED APPLICATION

This application is based upon and claims the benefit of priority from Japanese Patent Application No. 2019-192613 filed on Oct. 23, 2019, the contents of which are incorporated herein by reference.

BACKGROUND OF THE INVENTION

Field of the Invention

The present invention relates to a connection structure for connecting a printed board with an installation object which is arranged at a distance from one surface of the printed board, and an assembly including the connection structure.

Description of the Related Art

Japanese Laid-Open Patent Publication No. 2001-168243 discloses an electronic component module in which a second substrate is stacked in the thickness direction of a first substrate. In this electronic component module, fixing pins are connected to the first substrate and the second substrate and positioning pins are penetrated through the first and second substrates.

SUMMARY OF THE INVENTION

However, in the case of the electronic component module disclosed in Japanese Laid-Open Patent Publication No. 2001-168243, the fixing pins and the positioning pins are provided separately. Therefore, the mounting area of the pins on the first substrate and the second substrate increases, so that the number of parts, i.e., the number of the pins, increases accordingly. Thus, there is a concern that the connection structure for connecting the first substrate and the second substrate becomes large in size.

It is therefore an object of the present invention to provide a connection structure and an assembly that can be miniaturized.

A first aspect of the present invention resides in a connection structure configured to connect a printed board having formed therein a through hole with an installation object which is arranged at a distance from a first surface of the printed board, including: a support column member extending in one direction from one end to an opposite end, with the one end attached to the installation object and the opposite end having formed therein a screw hole, the support column member being configured to be non-insertable into the through hole; a surrounding member provided on the first surface of the printed board and configured to surround an opening of the through hole and to allow the opposite end of the support column member to be inserted into the surrounding member; and a fastener configured to fix the support column member to the printed board by being screw-engaged into the screw hole of the support column member inserted into the surrounding member, from a second surface side opposite to the first surface of the printed board.

A second aspect of the invention resides in an assembly including a plurality of the above connection structures, the printed board, and the installation object.

According to the above aspects of the present invention, it is possible to attach an installation object at a prescribed position to a printed board without separately providing positioning support column members for positioning the installation object relative to the printed board and fixing support column members for fixing the printed board and the installation object. Therefore, the connection structure as well as the assembly with such connection structures can be reduced in size.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

A preferred embodiment of the present invention will be described in detail below with reference to the accompanying drawings.

Embodiment

Figure 1:
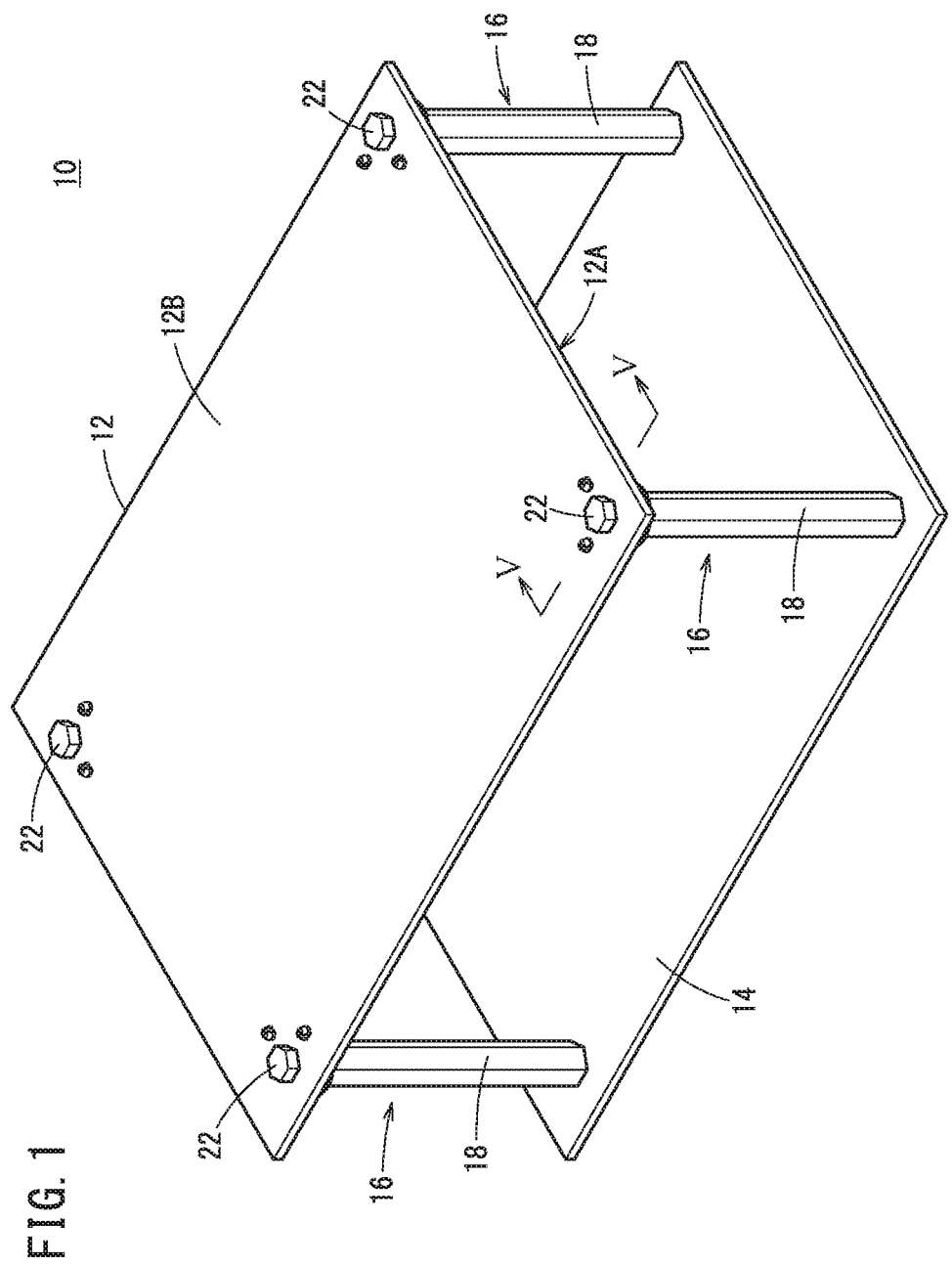
FIG. 1 is a schematic diagram showing a configuration of an assembly of an embodiment.
Figure 2:
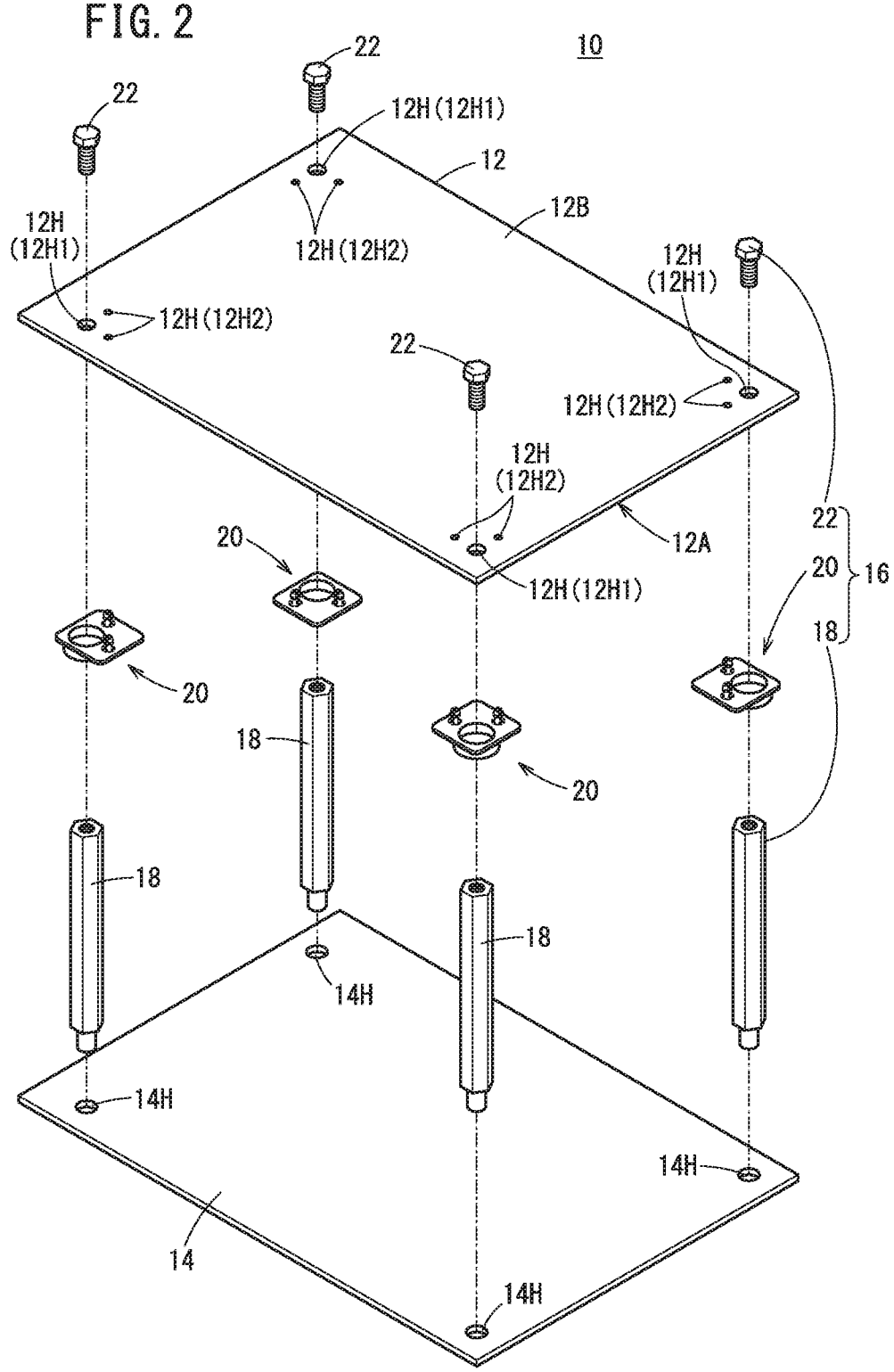
FIG. 2 is an exploded perspective view of the assembly of FIG. 1.

An assembly 10 of this embodiment will be described with reference to FIGS. 1 and 2. FIG. 1 is a schematic diagram showing a configuration of the assembly 10 of the embodiment, and FIG. 2 is an exploded perspective view of the assembly 10 of FIG. 1. The assembly 10 includes a printed board 12, an installation object 14, and a plurality of connection structures 16.

The printed board (printed wiring board) 12 has wiring formed on a substrate. The printed board 12 has formed therein a plurality of through holes 12H (FIG. 2) for mounting the installation object 14 on the printed board 12. The multiple through holes 12H include multiple first through holes 12H1 and multiple second through holes 12H2.

The installation object 14 is placed at a distance from a first surface (one surface) 12A of the printed board 12. The installation object 14 may be a plate member formed in a plate shape, or may be a housing in which electronic components and the like are housed. The plate member may be a substrate, a printed board, or a printed circuit board. The printed circuit board is one in which wiring is formed on the substrate and semiconductor elements are mounted. In the present embodiment, the installation object 14 is a substrate, as illustrated in FIGS. 1 and 2.

The multiple connection structures 16 each connect the printed board 12 and the installation object 14. The multiple connection structures 16 keep the printed board 12 and the installation object 14 in such a positional relationship that the installation object 14 is stacked over the printed board at a distance from the first surface 12A of the printed board 12. In the present embodiment, the multiple connection structures 16 maintain a positional relationship in which the printed board 12 and the installation object 14 (substrate) are substantially parallel to each other.

Each of the multiple connection structures 16 has a support column member 18, a surrounding member 20 (FIG. 2), and a fastener 22. Since the support column members 18, the surrounding members 20, and the fasteners 22 of the multiple connection structures 16 have the same configurations, the following description will be given concerning one support column member 18, one surrounding member 20, and one fastener 22.

Figure 3:
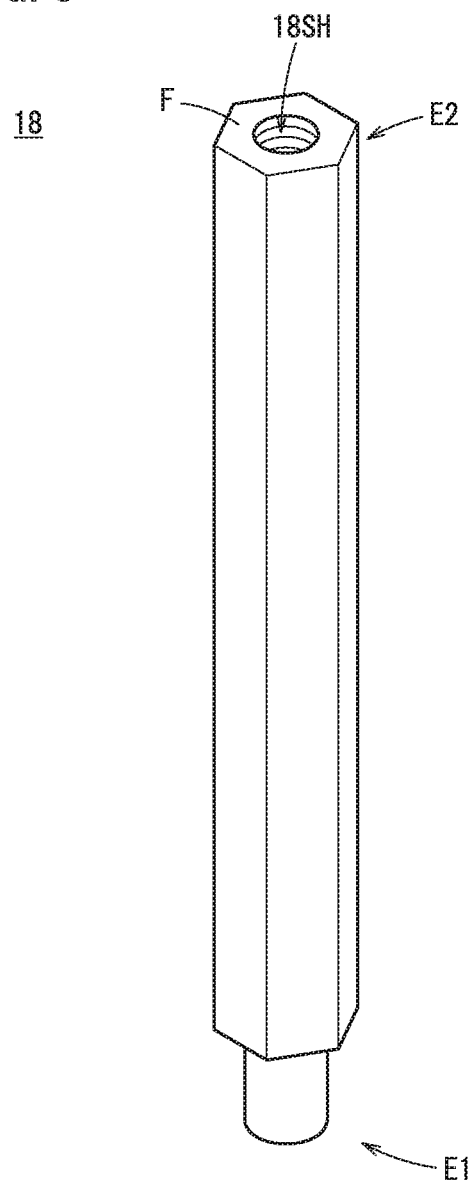
FIG. 3 is a perspective view showing a support column member.

The support column member 18 is arranged between the printed board 12 and the installation object 14. FIG. 3 is a perspective view showing the support column member 18. The support column member 18 is a rod-shaped member extending in one direction from a first end (one end) E1 to a second end (opposite end, another end) E2. The support column member 18 may be formed so as to have the same shape from the one end E1 to the opposite end E2, or have a different shape in part from the first end E1 to the second end E2. In the present embodiment, the first end E1 of the support column member 18 is formed in a cylindrical shape, and the part other than the first end E1 of the support column member 18 is formed in a regular hexagonal prism. Further, the first end E1 of the support column member 18 is thinner than the part other than the first end E1 of the support column member 18.

The support column member 18 cannot be inserted into the first through hole 12H1 (FIG. 2) formed in the printed board 12. In other words, the support column member 18 has a diameter larger than the opening diameter of the first through hole 12H1 in the printed board 12, and is formed thicker than the first through hole 12H1 of the printed board 12.

The first end E1 of the support column member 18 is attached to the installation object 14. For example, the first end E1 of the support column member 18 is attached to a predetermined position of the installation object 14 by being fitted or soldered in a hole 14H (FIG. 2) formed in the installation object 14 (substrate).

A screw hole 18SH is formed in the second end E2 of the support column member 18. The screw hole 18SH extends from the end face F of the second end E2 toward the first end E1 side along the extending direction in which the support column member 18 extends. In the present embodiment, the end face F of the second end E2 is a substantially flat plane perpendicular to the extending direction of the support column member 18. The end face F of the second end E2 may be a curved surface.

Figure 4A:
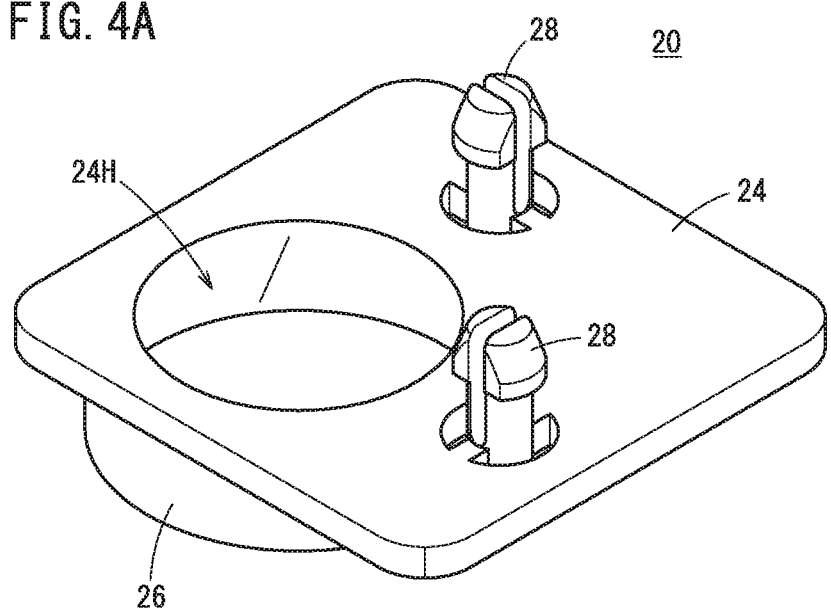
FIG. 4A is a perspective view showing a surrounding member.
Figure 4B:
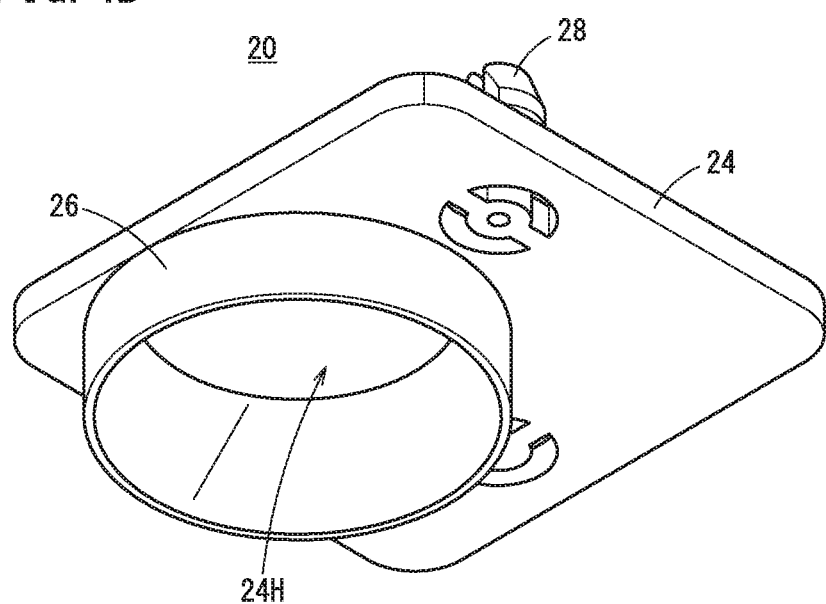
FIG. 4B is a perspective view showing the surrounding member from a viewpoint different from that of FIG. 4A.

The surrounding member 20 is provided on the first surface 12A of the printed board 12. FIGS. 4A and 4B are perspective views showing the surrounding member 20. The surrounding member 20 includes a base plate 24 having a through hole 24H larger than the first through hole 12H1 (FIG. 2) formed in the printed board 12, and a surrounding part 26 formed on one surface side of the base plate 24 so as to surround the opening of the through hole 24H. The through hole 24H has such a size that at least the second end E2 (FIG. 3) of the support column member 18 can be inserted thereinto.

The surrounding part 26 may have one or more cuts in the thickness direction of the base plate 24. That is, the surrounding part 26 also includes a configuration in which the entire periphery of the opening of the through hole 24H is not surrounded. It is desirable that a portion of the surrounding part 26 that does not surround the through hole 24H is smaller than a portion of the surrounding part 26 that surrounds the through hole 24H.

The surrounding member 20 is attachable to and detachable from the printed board 12, and is mounted to the printed board 12 on the first surface 12A thereof. This configuration makes it possible to change the position of the surrounding member 20 without changing the settings of the injection molding machine for molding the substrate of the printed board 12 as compared with the case where the surrounding member 20 is molded integrally with the printed board 12. As a result, the design can be easily changed.

In the present embodiment, the surrounding member 20 is mounted on the printed board 12 by snap-fit joints 28 provided on a surface of the base plate 24 opposite to the surface on which the surrounding part 26 is formed. In the present embodiment, the number of snap-fit joints 28 is two, but may be one or three or more. At least one snap-fit joint 28 has a claw at its tip for catching a second surface (another surface) 12B of the printed board 12 opposite to the first surface 12A. The claw of at least one snap-fit joint 28 that protrudes to the second surface 12B side through the second through hole 12H2 formed in the printed board 12, is caught on the second surface 12B of the printed board 12, whereby the surrounding member 20 is mounted on the printed board 12.

When mounted on the printed board 12, the surrounding member 20 surrounds the opening of the first through hole 12H1 formed in the printed board 12 so as to allow the second end E2 of the support column member 18 to be inserted. As a result, the support column member 18 can be positioned more accurately with respect to the first through hole 12H1 formed in the printed board 12 than in the case where no surrounding member 20 is provided.

The fastener 22 serves to fix the support column member 18 to the printed board 12. The fastener 22 is screw-engaged into the screw hole 18SH of the support column member 18 that is inserted into the interior of the surrounding member 20, from the second surface 12B side opposite to the first surface 12A of the printed board 12, whereby the support column member 18 is fixed to the printed board 12.

Figure 5:
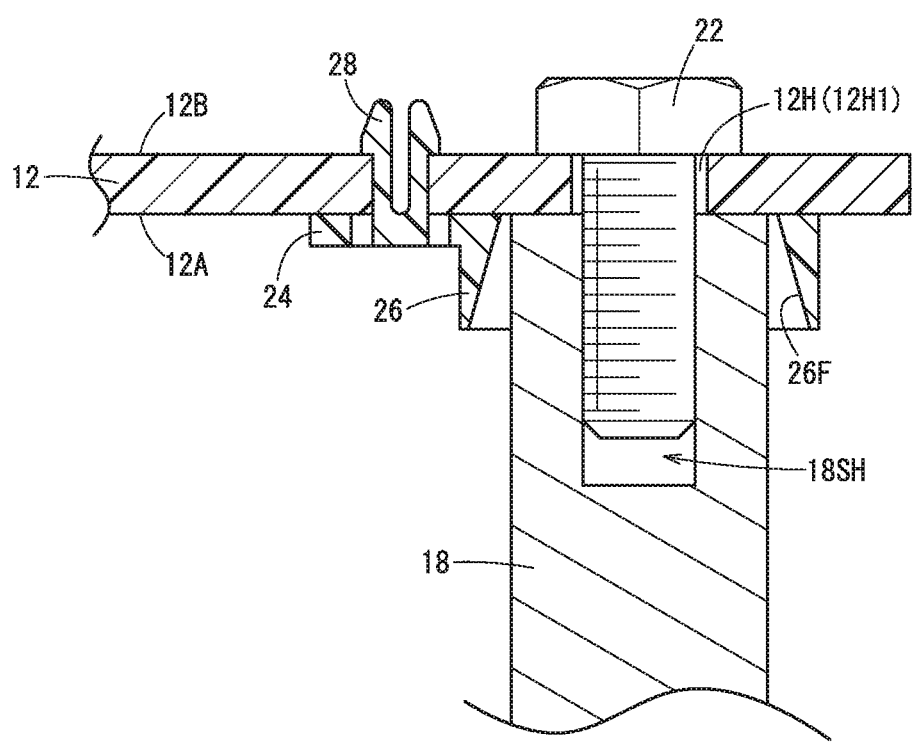
FIG. 5 is a sectional view taken along a line V-V in FIG. 1.

FIG. 5 is a sectional view taken along a line V-V in FIG. 1. The surrounding member 20 (the surrounding part 26) has an inclined surface 26F that is inclined so as to become higher as it separates away from the opening of the first through hole 12H1 formed in the printed board 12 in the direction along the first surface 12A of the printed board 12. In other words, the inner wall of the annular surrounding part 26 is inclined in a direction that forms an acute angle with respect to the first surface 12A of the printed board 12.

Owing to this configuration, when the second end E2 of the support column member 18 is inserted into the surrounding member 20, the support column member 18 can be guided by the inclined surface 26F so that the screw hole 18SH formed in the second end E2 of the support column member 18 is positioned in the opening of the first through hole 12H1. Therefore, the support column member 18 can be accurately positioned with respect to the first through hole 12H1 formed in the printed board 12.

The second end E2 of the support column member 18 inserted in the surrounding member 20 does not contact the base plate 24 of the surrounding member 20 but contacts first surface 12A of the printed board 12. Accordingly, the height from the first surface 12A of the printed board 12 to the installation object 14 can be made coincident with the length of the support column member 18, thus making it possible to reduce the tolerance.

Next, a method of assembling the assembly 10 will be briefly described. The assembling method includes an attaching step, a mounting step, an inserting step, and a fixing step.

The attaching step is a step of attaching the first end E1 of the support column member 18 to the installation object 14. The mounting step is a step of mounting the surrounding member 20 on the first surface 12A of the printed board 12. The inserting step is a step of inserting the second end E2 of the support column member 18 with the installation object 14 being attached to the first end E1, into the interior of the surrounding member 20 mounted on the first surface 12A of the printed board 12. The fixing step is a step of fixing the support column member 18 to the printed board 12 by screw-engaging the fastener 22, from the second surface 12B side opposite to the first surface 12A of the printed board 12, into the screw hole 18SH of the support column member 18 that has been inserted into the interior of the surrounding member 20.

Either the attaching step or the mounting step may be done first. After the attaching step and the mounting step, the inserting step is executed, and the fixing step is executed after the inserting step, whereby the assembly 10 is completed.

As described above, in the assembly 10 of the present embodiment, the position of the support column member 18 with respect to the first through hole 12H1 of the printed board 12 is determined by the surrounding member 20, and the support column member 18 thus arranged at the determined position can be fixed to the printed board 12.

Thus, it is possible to attach the installation object 14 to the printed board 12 at a prescribed position, without providing positioning support column members for positioning the installation object 14 relative to the printed board 12 or fixing support column members for fixing the printed board 12 and the installation object 14, separately. Therefore, the size reduction can be achieved.

[Modification]

The above embodiment may be modified as follows.

In the above embodiment, the surrounding member 20 is mounted on the first surface 12A of the printed board 12. However, the surrounding member 20 may be integrally formed with the printed board 12. As described above, in order to facilitate design change, it is desirable that the surrounding member 20 be mounted on the printed board 12 as in the above embodiment.

In the above embodiment, the snap-fit joint 28 may be unused. When there is no snap-fit joint 28, the surrounding member 20 is joined to the printed board 12 by an adhesive or the like that bonds the base plate 24 to the printed board 12. Even in this case, similarly to the above-described embodiment, the installation object 14 can be attached to the printed board 12 at a prescribed position. In order to reduce the number of parts (adhesive material), it is desirable that the surrounding member 20 be mounted on the printed board 12 by the snap-fit joint 28 as in the above embodiment.

In the support column member 18 in the above-described embodiment, a protrusion may be formed that projects from the end face F of the second end E2 outward in the extending direction of the support column member 18 and that can be inserted into the first through hole 12H1 formed in the printed board 12, and the protrusion may have formed therein the screw hole 18SH.

In this case, since the second end E2 of the support column member 18 is inserted into the first through hole 12H1 formed in the printed board 12 when the support column member 18 is fitted into the surrounding member 20, the accuracy with which the support column member 18 is positioned with respect to the first through hole 12H1 can be easily improved.

[Invention]

The invention grasped from the above embodiment and the modification will be described as the first and second aspects as follows.

(First Invention)

A first aspect of the invention resides in a connection structure (16) for connecting a printed board (12) having formed therein a through hole (12H1) with an installation object (14) which is arranged at a distance from a first surface (12A) of the printed board (12). The connection structure (16) includes: a support column member (18) extending in one direction from a first end (one end) (E1) to a second end (an opposite end) (E2), with the first end (E1) attached to the installation object (14) and the second end (E2) having formed therein a screw hole (18SH), the support column member being configured to be non-insertable into the through hole (12H1); a surrounding member (20) provided on the first surface (12A) of the printed board (12) and configured to surround the opening of the through hole (12H1) and to allow the second end (E2) of the support column member (18) to be inserted in the surrounding member; and a fastener (22) configured to fix the support column member (18) to the printed board (12) by being screw-engaged into the screw hole (18SH) of the support column member (18) inserted into the surrounding member (20), from a second surface (12B) side opposite to the first surface (12A) of the printed board (12).

With this configuration, it is possible to attach the installation object (14) at a prescribed position to the printed board (12) without separately providing the positioning support column member for positioning the installation object (14) relative to the printed board (12) and the fixing support column member for fixing the printed board (12) and the installation object (14). Therefore, the downsizing can be achieved.

The surrounding member (20) may be configured to have an inclined surface (26F) that is inclined so as to become higher as it separates away from the opening of the through hole (12H1) in the direction along the first surface (12A) of the printed board (12). With this configuration, when the second end (E2) of the support column member (18) is inserted into the surrounding member (20), the support column member (18) can be guided by the inclined surface (26F) so that the screw hole (18SH) formed in the second end (E2) of the support column member (18) is positioned in the opening of the through hole (12H1). Therefore, the support column member (18) can be accurately positioned with respect to the through hole (12H1) formed in the printed board (12).

The surrounding member (20) may be configured to be attachable to and detachable from the printed board (12) and mounted on the first surface (12A) of the printed board (12). This configuration makes it possible to change the position of the surrounding member (20) without changing the settings of the injection molding machine for molding the substrate of the printed board (12), as compared to the case where the surrounding member (20) is molded integrally with the printed board (12). As a result, the design can be easily changed.

The second end (E2) of the support column member (18) inserted into the surrounding member (20) may be configured to contact the first surface (12A) of the printed board (12). Owing thereto, the height from the first surface (12A) of the printed board (12) to the installation object (14) can be made coincident with the length of the support column member (18), thus making it possible to reduce the tolerance.

(Second Invention)

A second aspect of the invention resides in an assembly (10) including a plurality of the above connection structures (16), a printed board (12), and an installation object (14).

Provision of the above connection structures (16) makes it possible to attach the installation object (14) at a prescribed position to the printed board (12) without separately providing the positioning support column member and the fixing support column member, as in the first invention. Therefore, the assembly can be miniaturized.

The surrounding members (20) of the multiple connection structures (16) may have the same shape with each other. This makes it possible to reduce the number of parts, compared to the case where the surrounding members (20) of the multiple connection structures (16) have different shapes from each other.

The present invention is not particularly limited to the embodiment described above, and various modifications are possible without departing from the essence and gist of the present invention.

What is claimed is:

1. A connection structure configured to connect a printed board having formed therein a through hole with an installation object which is arranged at a distance from a first surface of the printed board, comprising:
   a support column member extending in one direction from one end to an opposite end, with the one end attached to the installation object and the opposite end having formed therein a screw hole, the support column member being configured to be non-insertable into the through hole;
   a surrounding member provided on the first surface of the printed board and configured to surround an opening of the through hole and to allow the opposite end of the support column member to be inserted into the surrounding member; and
   a fastener configured to fix the support column member to the printed board by being screw-engaged into the screw hole of the support column member inserted into the surrounding member, from a second surface side opposite to the first surface of the printed board.

2. The connection structure according to claim 1, wherein the surrounding member is configured to have an inclined surface that is inclined so as to become higher as it separates away from the opening of the through hole in a direction along the first surface of the printed board.

3. The connection structure according to claim 1, wherein the surrounding member is configured to be attachable to and detachable from the printed board and mounted on the first surface of the printed board.

4. The connection structure according to claim 1, wherein the opposite end of the support column member inserted into the surrounding member is configured to contact the first surface of the printed board.

5. An assembly comprising:
   a printed board having formed therein through holes;
   an installation object arranged at a distance from a first surface of the printed board; and
   a plurality of connection structures configured to connect the printed board and the installation object, wherein the plurality of connection structures each comprise:
   a support column member extending in one direction from one end to an opposite end, with the one end attached to the installation object and the opposite end having formed therein a screw hole, the support column member being configured to be non-insertable into the through hole;
   a surrounding member provided on the first surface of the printed board and configured to surround an opening of the through hole and to allow the opposite end of the support column member to be inserted into the surrounding member; and
   a fastener configured to fix the support column member to the printed board by being screw-engaged into the screw hole of the support column member inserted into the surrounding member, from a second surface side opposite to the first surface of the printed board.

6. The assembly according to claim 5, wherein the surrounding member has an inclined surface that is inclined so as to become higher as it separates away from the opening of the through hole in a direction along the first surface of the printed board.

7. The assembly according to claim 5, wherein the surrounding member is configured to be attachable to and detachable from the printed board and mounted on the first surface of the printed board.

8. The assembly according to claim 5, wherein the opposite end of the support column member inserted into the surrounding member contacts the first surface of the printed board.

9. The assembly according to claim 5, wherein the surrounding members of the plurality of connection structures have a same shape with each other.

* * * * *